United States Patent
Chen et al.

(10) Patent No.: US 8,773,206 B2
(45) Date of Patent: Jul. 8, 2014

(54) POWER AMPLIFIER APPARATUS AND POWER AMPLIFIER CIRCUIT

(75) Inventors: Huazhang Chen, Shenzhen (CN); Xiaojun Cui, Shenzhen (CN); Jianli Liu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 13/521,132

(22) PCT Filed: Oct. 27, 2011

(86) PCT No.: PCT/CN2011/081395
§ 371 (c)(1),
(2), (4) Date: Jul. 9, 2012

(87) PCT Pub. No.: WO2012/146006
PCT Pub. Date: Nov. 1, 2012

(65) Prior Publication Data
US 2014/0035680 A1 Feb. 6, 2014

(30) Foreign Application Priority Data
Apr. 29, 2011 (CN) .......................... 2011 1 0111402

(51) Int. Cl.
H03F 3/21 (2006.01)
H03F 3/195 (2006.01)
H03F 3/24 (2006.01)
H03F 1/02 (2006.01)
H03F 3/60 (2006.01)

(52) U.S. Cl.
CPC ................ *H03F 3/211* (2013.01); *H03F 3/195* (2013.01); *H03F 2200/411* (2013.01); *H03F 3/245* (2013.01); *H03F 1/0288* (2013.01); *H03F 3/602* (2013.01)
USPC ....................................... 330/295; 330/124 R

(58) Field of Classification Search
USPC ................................ 330/295, 124 R, 286, 53
See application file for complete search history.

(56) References Cited

U.S. PATENT DOCUMENTS

| 6,469,581 | B1 | 10/2002 | Kobayashi |
| 2004/0085134 | A1 | 5/2004 | Griffith et al. |
| 2008/0122542 | A1 | 5/2008 | Bowles et al. |
| 2012/0200353 | A1 | 8/2012 | Hayakawa et al. |

FOREIGN PATENT DOCUMENTS

| CN | 2545778 Y | 4/2003 |
| CN | 101567665 A | 10/2009 |
| CN | 101589550 A | 11/2009 |
| CN | 102185565 A | 9/2011 |

OTHER PUBLICATIONS

International Search Report for PCT/CN2011/081395 dated Dec. 15, 2011.

*Primary Examiner* — Hieu Nguyen
(74) *Attorney, Agent, or Firm* — Ling Wu; Stephen Yang; Ling and Yang Intellectual Property LLC

(57) ABSTRACT

The present invention relates to a power amplifier apparatus and a power amplifier circuit thereof, the power amplifier circuit uses Doherty circuit structure, and it uses a high voltage heterojunction bipolar transistor (HVHBT) power amplifier to achieve a Carrier amplifier with the Doherty circuit structure, and uses a high electron mobility transistor (HEMT) power amplifier to achieve a Peak amplifier with the Doherty circuit structure. The power amplifier apparatus and a power amplifier circuit thereof in the present invention improves the efficiency of the power amplifier.

1 Claim, 3 Drawing Sheets

POWER AMPLIFIER APPARATUS AND POWER AMPLIFIER CIRCUIT

TECHNICAL FIELD

The present invention relates to the field of communications, and more especially, to a power amplifier apparatus and power amplifier circuit in the field of communications.

BACKGROUND OF THE RELATED ART

In face of increasingly fierce competition in the market, the efficiency of the base station products has become the focus of competition in the industry, the efficiency of the main component—power amplifier—that determines the efficiency of the base station has become a top priority, and the industry has invested in the research on the efficiency improvement technologies, wherein, the Doherty technology is a mature technology that is most widely used at present, and the amplifier manufacturers have begun producing and applying the Doherty amplifiers in mass, how to further improve the efficiency in this technology is particularly important.

The Doherty technology was invented by W. H. Doherty in 1936, it was originally used in traveling wave transistors to provide high power transmitter for broadcasting, its structure is simple and highly efficient.

The conventional Doherty structure consists of two power amplifiers: a main power amplifier (also called the carrier power amplifier) and an auxiliary amplifier (also known as Peak Power Amplifier), wherein, the carrier power amplifier works in Class B or AB, and the peak power amplifier works in Class C. The two power amplifiers do not work in turns, but the main amplifier works all the time, and the auxiliary amplifier only works when the preset peak power is reached. The 90 degree quarter-wavelength line after the carrier power amplifier is for impedance transformation, its purpose is to play the role of reducing the apparent impedance of the carrier power amplifier when the auxiliary power amplifier works, thus to ensure that the active load impedance consisting of the auxiliary power amplifier and the subsequent circuits reduces when the auxiliary power amplifier works, thus the output current of the carrier power amplifier is amplified. Due to the quarter-wavelength line after the main power amplifier, in order to make the outputs of the two power amplifiers in phase, 90° phase shift is also needed before the auxiliary power amplifier, as shown in FIG. 1.

The main power amplifier works in Class B, when the input signal is relatively small, only the main power amplifier is in a working condition; when the output voltage of the main power amplifier transistor reaches the peak saturation point, the efficiency can reach 78.5% in theory. If the excitation is doubled at this time, the main power amplifier is already saturated when a half of the peak value is reached, and the efficiency also reaches 78.5% of the maximum, at this time, the auxiliary power amplifier also begins to work together with the main power amplifier. The introduction of the auxiliary power amplifier makes the load reduced from the perspective of the main power amplifier, since the auxiliary power amplifier for the load is equivalent to connecting a negative impedance serially, even if the output voltage of the main power amplifier is saturated and constant, the output power continues to increase (the current flowing through the load becomes larger) due to the load reduction. When the excitation peak is reached, the auxiliary power amplifier also reaches the maximum point of its own efficiency, and the total efficiency of the two power amplifiers is much higher than the efficiency of a single class B power amplifier. The maximum efficiency 78.5% of a single class B power amplifier appears at the peak value, but currently the efficiency 78.5% appears at a half of the peak value, so this kind of system architecture can achieve very high efficiency (each amplifier reaches its maximum output efficiency).

Due to the requirements of the base station system on set-top output power, the requirement for the gain of RF power amplifier is tens of dB, thus one stage of amplification is not enough, generally 3-4 stages of amplification are needed, that is, the pre-drive, the drive and the final stage. Currently, the link structure commonly used in the industry is as follows: the pre-drive stage uses the RF small-signal amplifier, and its working mode is CLASS A; the drive and final stages use the same type of RF power amplifier transistors (currently, the industry uses the LDMOS devices), the working mode of the drive stage is CLASS AB, and the final stage is the Doherty structure.

With the industry's green concept, the requirements by the operators on the efficiency of the communication system is almost harsh, even with the advanced Doherty technology, the power amplifier efficiency is still unable to meet their increasing demands, it is necessary to make continuous improvements on the basis of the Doherty technology to achieve continuous efficiency improvement.

In the traditional RF power amplifier, the Doherty structure is only applied to the final stage, and the drive stage and the final stage use the same type of power amplifier transistors, whose advantages are: the supply voltages and the bias modes are the same, thus the design of the bias circuit is simple; since the amplifier transistors are the same type, the discretion of the mass production is relatively easy to control. However, a fact that cannot be ignored is: the industry's leading LDMOS device has been developed to the eighth generation, its cost is low, but its performance has very limited room for improvement, which cannot meet the environmental protection requirements; in addition, although the power amplifier efficiency is primarily determined by the final stage, the final stage contributes 90% of the operating current, thus further enhancing the efficiency of the final stage has great significance, but the 10% contributed by the drive stage cannot be ignored even more, therefore, it also needs to improve the circuit of the drive stage.

From the signal power spectrum distribution of different schemes of the current communication systems, the 70%-80% energy output by the power amplifier is concentrated around the average power, that is, most of the operating current of the final stage power amplifier which applies the Doherty technology is contributed by the Carrier amplifier, thus enhancing the efficiency of the final stage Carrier amplifier has great significance in improving the efficiency of the entire power amplifier. Meanwhile, the efficiency can be further improved in the drive stage part, which can also better realize the efficiency improvement of the entire power amplifier.

SUMMARY OF THE INVENTION

The technical problem to be solved in the present invention is to provide a power amplifier apparatus and a power amplifier circuit to solve the problem that the efficiency of a power amplifier cannot meet the requirements.

To solve the above technical problem, the present invention provides a power amplifier apparatus, the apparatus comprises one or more series drive stage power amplifier circuits as well as a final stage power amplifier circuit connecting with the output of the last drive stage power amplifier circuit, both the drive stage power amplifier circuits and the final stage power amplifier circuit use the Doherty circuit structure, the drive stage power amplifier circuits use Lateral double-diffused metal-oxide semiconductor field effect transistor (LDMOS) power amplifiers to implement a Carrier amplifier and a Peak amplifier with the Doherty circuit structure, said final stage power amplifier circuit uses a High Voltage Heterojunction Bipolar Transistor (HVHBT) power amplifier to achieve the Carrier amplifier with the Doherty circuit structure, and uses a High Electron Mobility Transistor (HEMT) power amplifier to achieve the Peak amplifier with the Doherty circuit structure.

To solve the above technical problem, the present invention provides another power amplifier apparatus, the apparatus comprises one or more series drive stage power amplifier circuits as well as a final stage power amplifier circuit connecting with the output of the last drive stage power amplifier circuit, both the drive stage power amplifier circuit and the final stage power amplifier circuit use the Doherty circuit structure, the drive stage power amplifier circuits and the final stage power amplifier circuit uses a High Voltage Heterojunction Bipolar Transistor (HVHBT) power amplifier to achieve the Carrier amplifier with the Doherty circuit structure, and uses a High Electron Mobility Transistor (HEMT) power amplifier to achieve the Peak amplifier with the Doherty circuit structure.

To solve the above technical problem, the present invention provides a power amplifier circuit of the power amplifier apparatus, the power amplifier circuit uses the Doherty circuit structure, and uses the High Voltage Heterojunction Bipolar Transistor (HVHBT) power amplifier to achieve the Carrier amplifier with the Doherty circuit structure and uses the High Electron Mobility Transistor (HEMT) field effect transistor power amplifier to achieve the Peak amplifier with the Doherty circuit structure.

Preferably, the power amplifier circuit is the drive stage or the final stage of the power amplifier apparatus.

To solve the above technical problem, the present invention provides another power amplifier circuit of the power amplifier apparatus, and the power amplifier circuit comprises:

a power divider sub-circuit;

a carrier amplifier connecting with the output of the power divider sub-circuit, wherein the carrier power amplifier uses a High Voltage Heterojunction Bipolar Transistor (HVHBT) power amplifier to achieve the carrier power amplifier function;

at least one peak amplifier connecting with the output of the power divider sub-circuit, whereon the peak amplifier uses a High Electron Mobility Transistor (HEMT) power amplifier to achieve the peak power amplifier function;

a power combiner sub-circuit connecting with the outputs of the carrier amplifier and the peak amplifier.

Preferably, the power amplifier circuit is the drive stage or the final stage of the power amplifier apparatus.

The power amplifier apparatus and the power amplifier circuit in the present invention use the Doherty technology and provide a new combination of the Carrier amplifier and the Peak amplifier, compared to the prior art, the efficiency of the power amplifier is improved.

PREFERRED EMBODIMENTS OF THE PRESENT INVENTION

The Carrier amplifier and the Peak amplifier in a final stage power amplifier using the Doherty technology in the power amplifier apparatus of the present invention are newly combined, the new combination architecture is used to improve the efficiency of the final stage Carrier amplifier; the drive stage power amplifier circuit uses the high efficient Doherty circuit structure, thus improving the efficiency of the power amplifier apparatus.

The power amplifier apparatus of the present invention comprises one or more series drive stage power amplifiers, as well as the final stage power amplifier connecting with the output of the last drive stage power amplifier circuit, in particular, the drive stage power amplifier circuit in the present invention uses the Doherty circuit structure.

Figure 2:
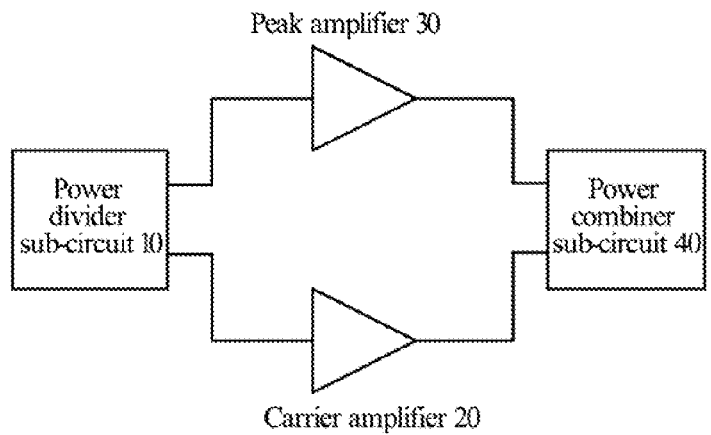
FIG. 2 is a schematic diagram of the Doherty circuit structure.

Specifically, as shown in FIG. 2, the Doherty circuit structure comprises: a power divider sub-circuit 10, one carrier amplifier 20 and at least one peak amplifier 30 connecting with the outputs of the power divider sub-circuit 10, as well as a power combiner sub-circuit 40 connecting to the outputs of the carrier amplifier and the peak amplifier.

Figure 1:
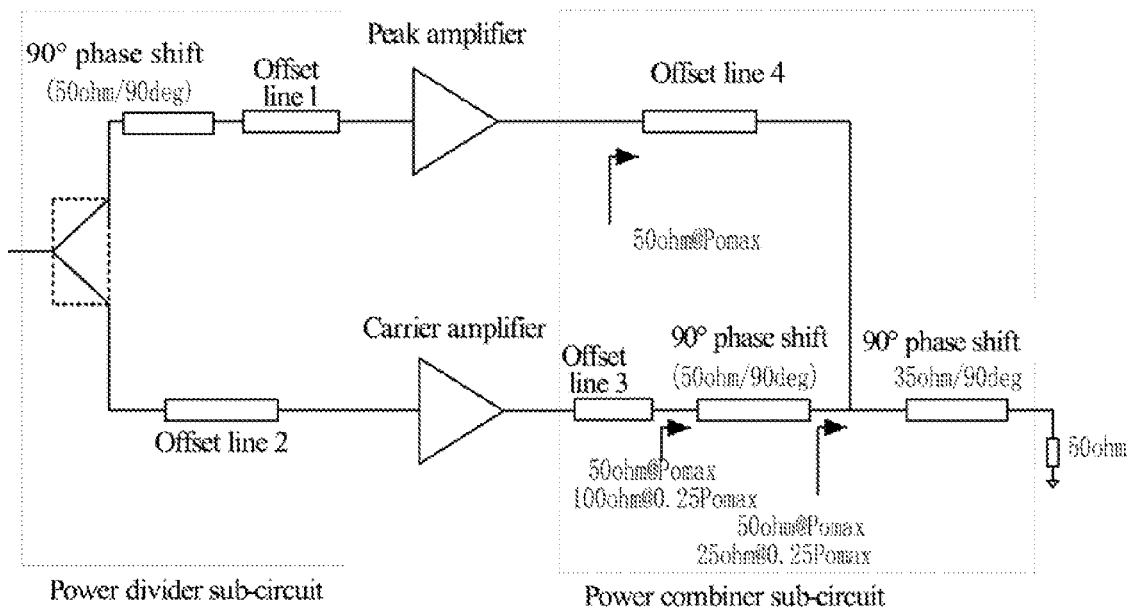
FIG. 1 is a block diagram of a conventional Doherty power amplifier.

Understandably, the main amplifier 20, also known as the Carrier amplifier, provides the main power amplification, such as providing power amplification continuously. The auxiliary amplifier, also known as the Peak amplifier, provides the auxiliary power amplification, for example, it only works under certain conditions (for example, when the preset peak is achieved). As shown in FIG. 1, the power divider sub-circuit 10 comprises a series of functional devices such as the power divider, the 90 degree—a quarter of wavelength line, and the phase offset line, the power combiner sub-circuit 40 comprises a series of functional devices such as the 90 degree—a quarter of wavelength line, the phase offset line, and the impedance transformer; the specific type, model and connection relationship of the device are designed, selected and matched according to specific requirements and are not limited in the present invention.

The main amplifier and the auxiliary amplifier can be achieved with various types of amplifier transistors, preferably with the lateral double-diffused metal oxide semiconductor (LDMOS), alternatively, the main amplifier uses the high-voltage heterojunction bipolar transistor (HVHBT), and the auxiliary amplifier uses the High Electron Mobility Transistor (HEMT) power amplifier to achieve the function of the auxiliary power amplifier.

The HVHBT is a HBT processing device that is able to work under high voltage, the high voltage is an operating voltage above 12V. It comprises but is not limited to the Tripower series power amplifier devices from the U.S. Triquint company.

In the prior art, the final stage power amplifier circuit is also implemented with the Doherty structure circuit shown in FIG. 2, preferably, the high-voltage heterojunction bipolar transistor (HVHBT) amplifier transistor is used to achieve the function of the main power amplifier, and the High Electron Mobility Transistor (HEMT) power amplifier is used to achieve the function of the auxiliary power amplifier.

In the following, the embodiments of the present invention will be described in detail with combination of the accompanying drawings. It should be noted that without conflict, the embodiments and the features of the embodiments in this application can be combined with each other.

The First Embodiment

Figure 3:
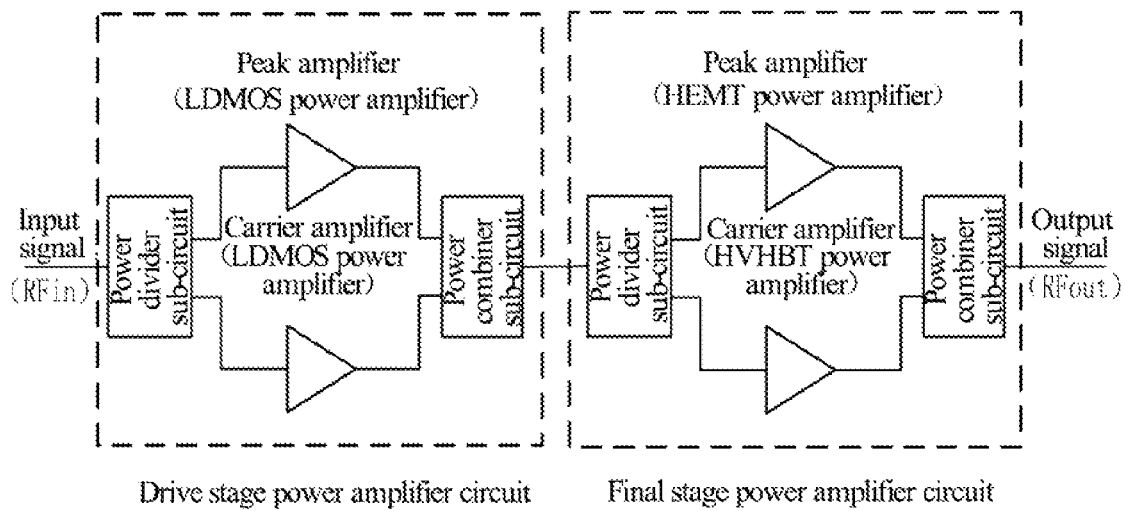
FIG. 3 is a schematic diagram of a first embodiment of the present invention.

The first embodiment of the power amplifier apparatus is shown in FIG. 3, the drive stage in this embodiment uses two-path Doherty structure circuit and uses the LDMOS power amplifiers to achieve the functions of the main power amplifier and the auxiliary power amplifier, the final stage uses the two-path Doherty structure circuit and uses the HVHBT power amplifier to achieve the function of the main power amplifier and uses the High Electron Mobility Transistor (HEMT) power amplifier to realize the function of the auxiliary power amplifier.

Specifically, the drive stage amplifier part is achieved with the Doherty circuit structure; its Carrier amplifier and Peak amplifier both use the Lateral double-diffused metal-oxide semiconductor (LDMOS, based on Si) power amplifier transistors;

at the same time of applying the Doherty circuit in the drive stage, the final stage is also achieved with the newly combined two-path Doherty circuit structure.

For the final stage two-path Doherty structure (including the traditional two-path symmetrical Doherty, the asymmetric Doherty, and so on) as well as the architecture of one Carrier plus one Peak evolved on this basis, the High Voltage Heterojunction Bipolar Transistor (HVHBT based on the GaAs) power amplifier can be used as the Carrier amplifier while the High Electron Mobility Transistor (HEMT, based on the GaN) power amplifier is used as the Peak amplifier to achieve the significant efficiency improvement.

The Second Embodiment

Figure 4:
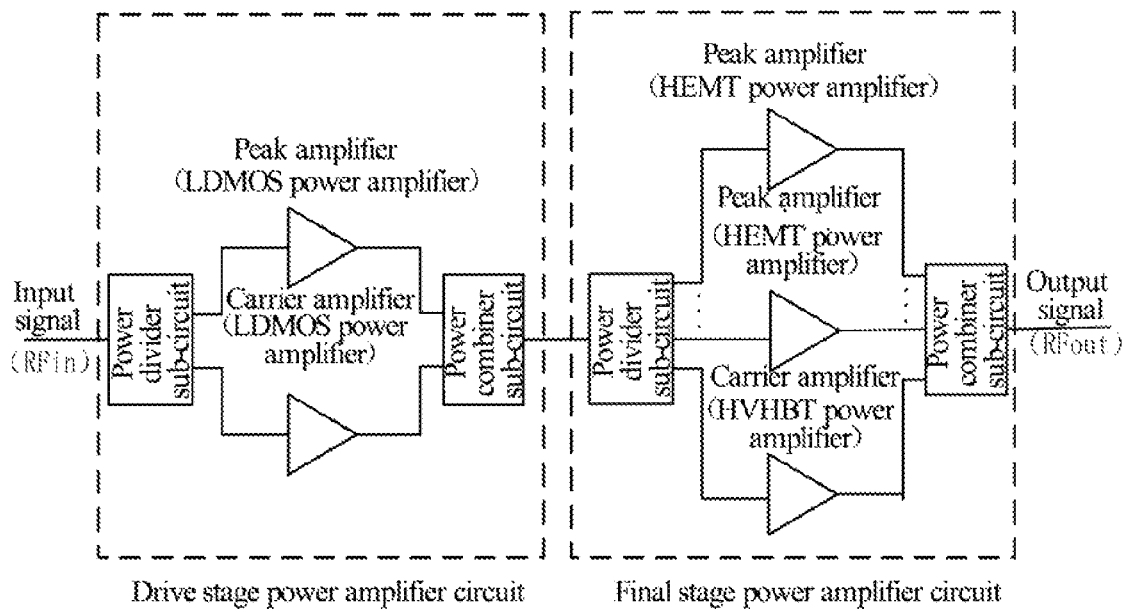
FIG. 4 is a schematic diagram of a second embodiment of the present invention.

The second embodiment of the power amplifier apparatus is shown in FIG. 4, the drive stage in this embodiment uses the two-path Doherty structure circuit and uses the LDMOS power amplifiers to achieve the functions of the main amplifier and the auxiliary amplifier, the final stage uses the multi-path Doherty structural circuit and uses the HVHBT power amplifier to achieve the function of the main power amplifier, and uses the High Electron Mobility Transistor (HEMT) power amplifier to realize the function of the auxiliary power amplifier.

Specifically, the drive stage amplifier part is achieved with the Doherty circuit structure, and its Carrier amplifier and Peak amplifier both use the LDMOS power amplifiers;

at the same time of using the Doherty circuit in the drive stage, the final stage also uses the newly combined multi-path Doherty circuit structure to implement.

For the final stage multi-path Doherty structure as well as the architecture of one Carrier plus multiple Peaks evolved on the basis of the Doherty structure, the HVHBT amplifier transistor can be used as the Carrier amplifier and the HEMT power amplifiers can be used as multiple Peak amplifiers to achieve the efficiency improvement.

The Third Embodiment

Figure 5:
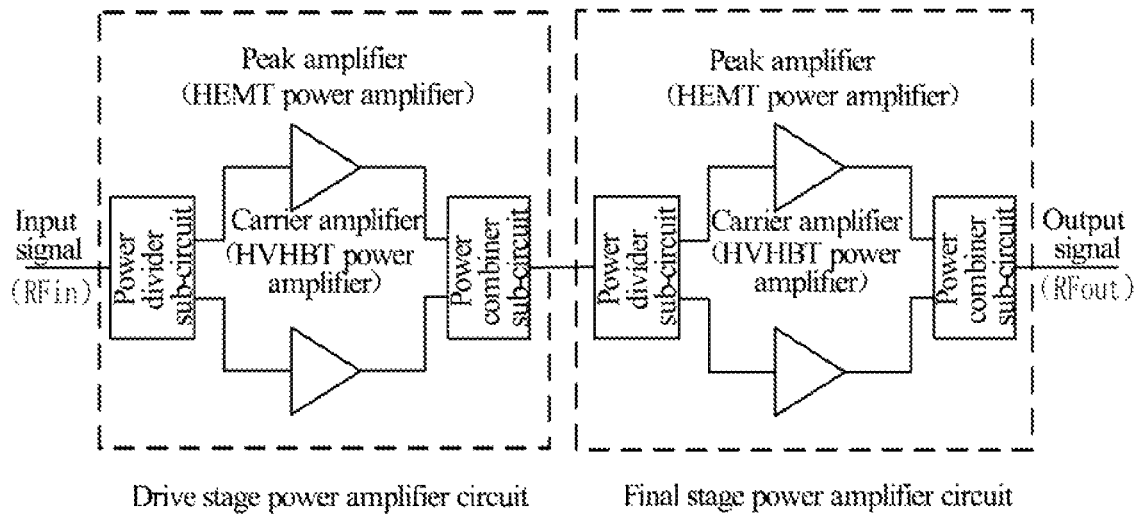
FIG. 5 is a schematic diagram of a third embodiment of the present invention.

The third embodiment of the power amplifier apparatus is shown in FIG. 5, the circuit structures of the third embodiment and the first embodiment are the same, the difference lies in that, the drive stage uses the HVHBT power amplifier as the Carrier amplifier and the HEMT power amplifiers as the Peak amplifiers.

The Fourth Embodiment

Figure 6:
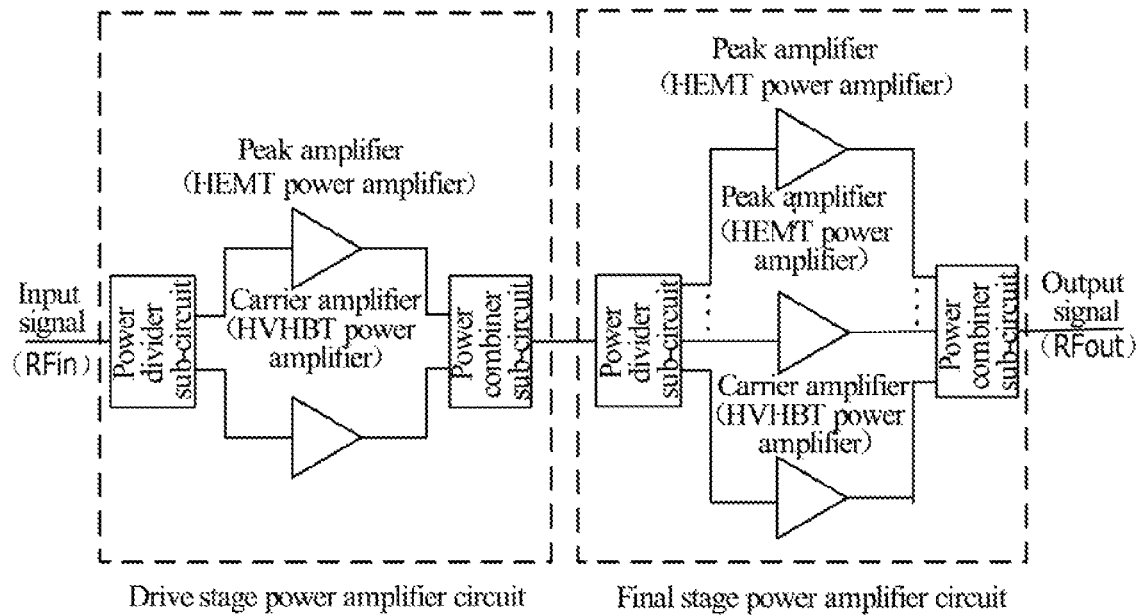
FIG. 6 is a schematic diagram of a fourth embodiment of the present invention.

The fourth embodiment of the power amplifier apparatus is shown in FIG. 6, the circuit structures of the fourth embodiment and the second embodiment are the same, the difference lies in that, the drive stage uses the HVHBT power amplifier as the Carrier amplifier and the HEMT power amplifiers as the Peak amplifiers.

The key point of the present invention is: the drive stage uses the high efficient Doherty circuit structure to promote the drive stage efficiency; meanwhile, the drive stage or the final stage also uses the breakthrough newly combined way, and the advantage of the high efficiency of the HVHBT power amplifier is fully used, the HVHBT power amplifier acts as the Carrier amplifier to improve the efficiency, moreover, with the advantages such as the relatively high efficiency and the full range of power devices of the HEMT power amplifier, the HVHBT power amplifier is used to as the Peak amplifier to achieve the optimal performance.

With the method and apparatus of the present invention, compared with the current drive stage using the CLASS AB mode and the final stage Carrier and Peak amplifiers using the LDMOS Doherty power amplifiers, the entire power amplifier efficiency can be significantly improved;

the LDMOS device development is very mature, wherein, the power devices have full range of types and the cost is low. The drive stage uses the LDMOS device+the Doherty structure, which not only improves the efficiency and but also ensures the cost.

Since the types of the current HVHBT products is few (only 1-2), it cannot achieve the power level requirements on the diversification of the base station products; while the HEMT power amplifier product development is relatively mature, the products from the manufacturers are more complete, therefore, the final stage power amplifier part in the method and apparatus of the present invention can use different models of the LDMOS products as the Peak amplifiers according to different power levels, and the Peak amplifier can be flexibly combined with the Carrier amplifier which uses the HVHBT amplifier transistor, and can be achieved with different Doherty structures (symmetric, asymmetric, multi-path, and so on) as needed, thus not only the optimal performance but also the convenience and flexibility can be ensured.

The specific steps for implementing the power amplifier apparatus of the present invention comprise:

1. determine the model of the HVHBT amplifier transistor used in the final stage Carrier amplifier according to different implementation needs;

2. compare, analyze and determine the Doherty structure to be used according to different implementation needs;

3. determine the model of the HEMT power amplifier used in the final stage Peak amplifier according to the different implementation needs;

4. according to the gain of the final stage, determine the model of the HVHBT power amplifier or the LDMOS power amplifier used in the drive stage Carrier amplifier, and the model of the LDMOS power amplifier used in the Peak amplifier;

5. complete the matching design of the final stage and the drive stage amplifier transistors as well as the design of the power distribution and the power combination parts in the block diagram;

6. complete the design of the rest parts of the apparatus in the present invention.

The specific example is as follows:

According to the 55 W Doherty power amplifier design of the 2.1 GHz UMTS system applications (PAR: 6 dB), it needs to use two amplifier transistors whose total saturation power should be at least more than 200 W. With the combination of the existing devices from the power amplifier transistor manufacturers, it could be achieved by using two 120 W-LDMOS power amplifiers through the symmetric Doherty structure, in accordance with the industry's current device technology level, its single final stage power amplifier efficiency is about 52%; when the method of this invention is used (the Carrier amplifier uses the 120 W-HVHBT power amplifier and the Peak amplifier uses the 120 W-HEMT power amplifier), the single final amplifier efficiency is about 58%, which is increased by about 12%.

For the Doherty drive stage design, since the final stage at least uses more than 200 W of saturation power, the gain of the current 2.1 GHz-final stage power amplifier Doherty is about 16 dB, therefore, the drive stage can use two 10 W-LDMOS power amplifiers to design the Doherty drive stage amplifier part, therefore, compared with the original CLASS AB design, the drive stage efficiency can further be increased by about 20% (for example: the efficiency of using the CLASS AB to design the drive level is 15%, and the efficiency can be up to 18% when using the Doherty design).

Therefore, with the method and apparatus of the present invention, the efficiency can be greatly improved on the premise of ensuring the cost.

The present invention further provides a drive stage power amplifier circuit of the power amplifier apparatus, and the drive stage circuit uses the Doherty circuit structure, and uses the LDMOS power amplifiers to achieve the Carrier amplifier and the auxiliary amplifier with the Doherty circuit structure.

In addition, the present invention also provides a power amplifier circuit of the power amplifier apparatus, and the power amplifier circuit uses the Doherty circuit structure, uses the HVHBT power amplifier to achieve the Carrier amplifier with the Doherty circuit structure, and uses the HEMT power amplifier to achieve the Peak amplifier with the Doherty circuit structure.

Specifically, the power amplifier circuit is the drive stage or the final stage of the power amplifier apparatus, comprising:

a power divider sub-circuit;

a carrier amplifier connecting with the output of the power divider sub-circuit, wherein the carrier power amplifier uses a high-voltage heterojunction bipolar transistor (HVHBT) power amplifier to achieve a carrier power amplifier function;

at least one peak amplifier connecting with the output of the power divider sub-circuit, wherein the carrier amplifier uses a HEMT power amplifier to achieve a peak power amplifier function;

and a power combiner sub-circuit connecting with the outputs of the carrier amplifier and the peak amplifier.

In summary, the implementation of the present invention is simple, and its design and debugging are convenient and flexible, and the cost is low, those skilled in the field can easily implement the present invention with this specification. Within the working frequency range of the Doherty power amplifier, its efficiency specification can be greatly improved, and the apparatus can be widely used in the designs of a variety of Doherty power amplifiers.

The purpose of the present invention is to newly combine the Carrier amplifier and the Peak amplifier in the final stage power amplifier using the Doherty technology, the newly combined structure is used to improve the efficiency of the final Carrier stage power amplifier; the high efficient circuit structure is used in the drive stage, thus to achieve the significant improvement of the overall Doherty power amplifier efficiency from two aspects.

INDUSTRIAL APPLICABILITY

The power amplifier apparatus and the power amplifier circuit in the embodiments of the present invention use the Doherty technology and provide a new combination of the Carrier amplifier and the Peak amplifier, compared to the prior art, it can improve the efficiency of the power amplifier.

What is claimed is:

1. A power amplifier apparatus, comprising one or more drive stage power amplifier circuits in series, as well as a final stage power amplifier circuit connecting with the output of the last drive stage power amplifier circuit, wherein, the final stage power amplifier circuit is implemented using a power amplifier circuit structure;

wherein, the power amplifier circuit comprises:

a power divider sub-circuit;

a carrier amplifier connecting with an output of the power divider sub-circuit, wherein the carrier amplifier is implemented using a High Voltage Heterojunction Bipolar Transistor (HVHBT) power amplifier;

one or more peak amplifiers connecting with an output of the power divider sub-circuit, wherein each peak amplifier is implemented using a High Electron Mobility Transistor (HEMT) power amplifier; and a power combiner sub-circuit connecting with outputs of the carrier amplifier and the peak amplifiers;

said each drive stage power amplifier circuits uses the Doherty circuit structure, wherein both the Carrier amplifier and the one or more Peak amplifiers are implemented either both using Lateral double-diffused metal-oxide semiconductor field effect transistor (LDMOS) power amplifiers or the Carrier amplifier is implemented using the HVHBT power amplifier and the one or more Peak amplifiers are implemented using the HEMT power amplifiers.

* * * * *